(12) United States Patent
Taravade

(10) Patent No.: US 6,271,911 B2
(45) Date of Patent: Aug. 7, 2001

(54) APPARATUS FOR ENHANCING IMAGE CONTRAST USING INTENSITY FILTRATION

(75) Inventor: Kunal N. Taravade, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/737,504

(22) Filed: Dec. 15, 2000

Related U.S. Application Data

(63) Continuation of application No. 09/557,946, filed on Apr. 4, 2000, which is a continuation of application No. 09/106,720, filed on Jun. 29, 1998, now abandoned.

(51) Int. Cl.[7] ............................. G03B 27/54; G03B 27/42
(52) U.S. Cl. ................................. 355/67; 355/53
(58) Field of Search .......................... 355/53, 55, 67–77; 356/399–400; 250/492.2, 492.22; 359/629–640, 652–654, 885, 887, 888

(56) References Cited

U.S. PATENT DOCUMENTS

| | | |
|---|---|---|
| 4,946,245 | 8/1990 | Chamberlin et al. ............. 350/96.19 |
| 5,137,363 | 8/1992 | Kosugi et al. ........................ 356/401 |
| 5,359,388 | 10/1994 | Hollman .................................. 355/53 |
| 5,604,629 | 2/1997 | Hunter et al. ......................... 359/359 |
| 5,614,990 | 3/1997 | Bruce et al. ............................ 355/71 |
| 5,700,332 | 12/1997 | Brown et al. ........................ 136/253 |
| 5,703,374 | 12/1997 | Caprari ............................... 250/492.2 |

*Primary Examiner*—Alan A. Mathews
*Assistant Examiner*—Hung Henry Nguyen

(57) ABSTRACT

A photolithography apparatus for deep UV enhances contrast and also therefore increases the resolution of patterned images by passing only intensities that fall within a specific minimum threshold value, resulting in a more exact aerial image replicating the mask image. this photolithography apparatus employs a different approach to contrast enhancement which is distinguished from previous methods by eliminating the need for an extra layer of contrast enhancement on top of the resist, thereby reducing the number of processing steps in semiconductor fabrication.

9 Claims, 2 Drawing Sheets

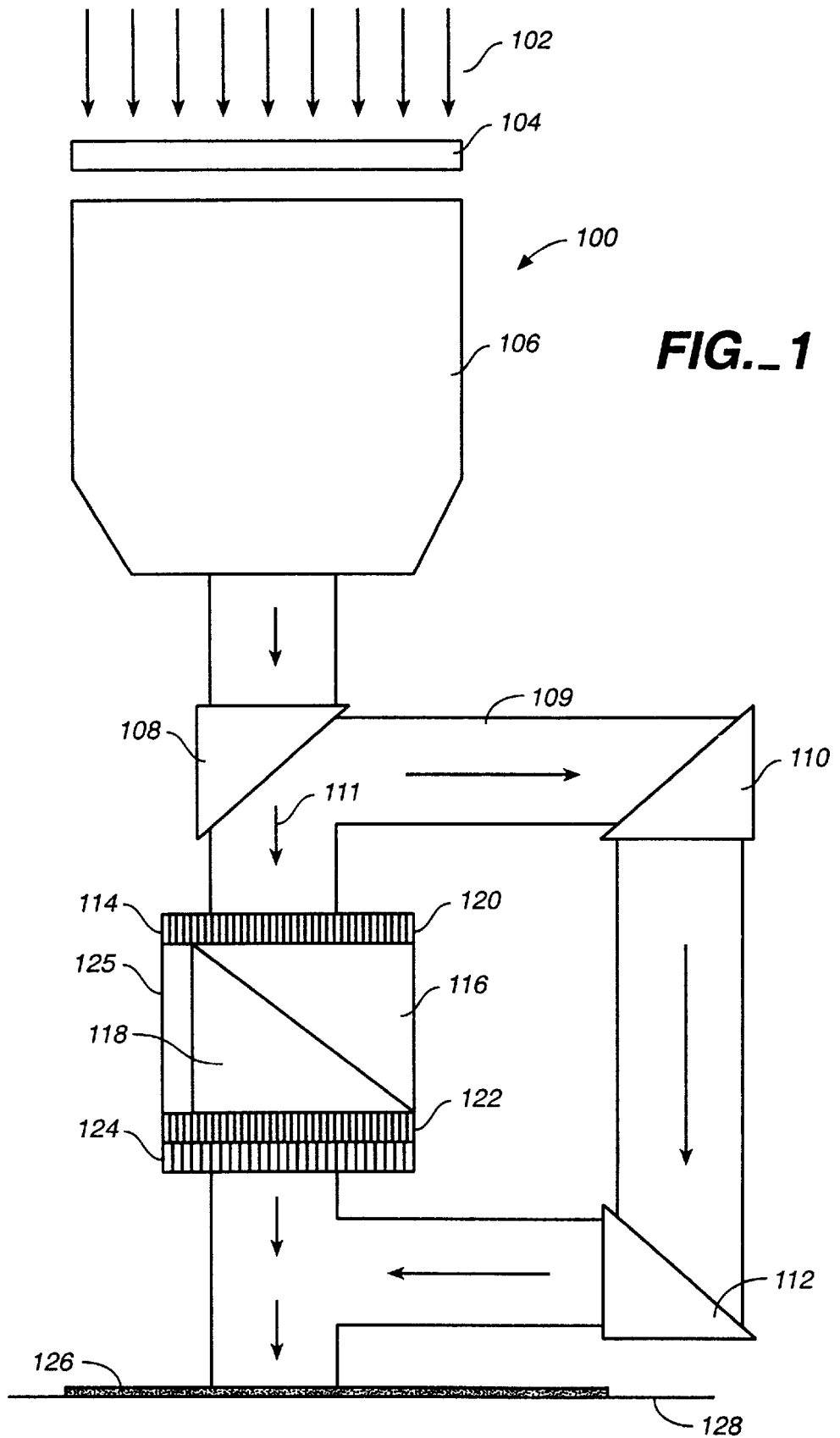
FIG._1

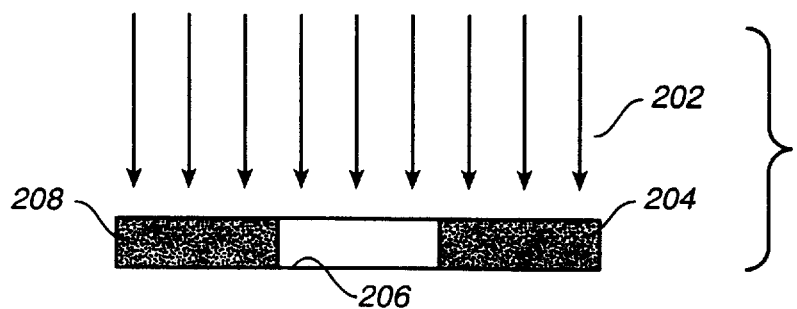
FIG._2
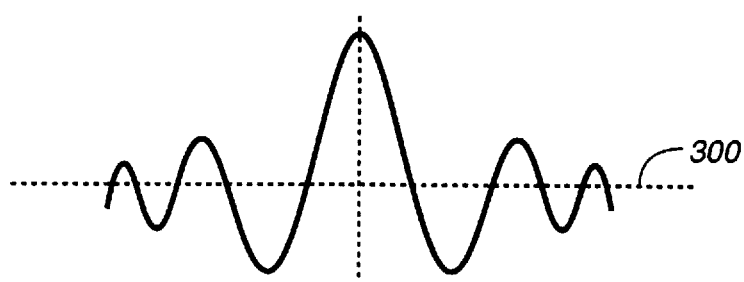
FIG._3
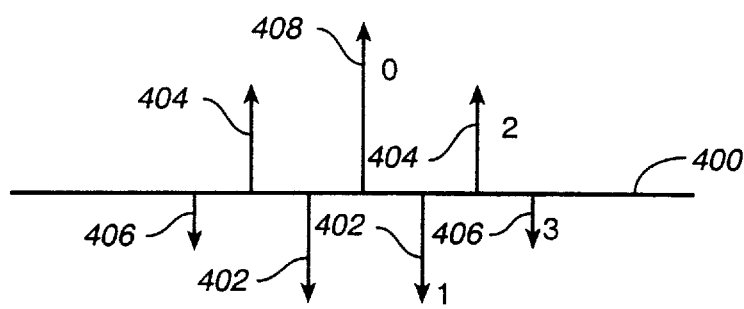
FIG._4
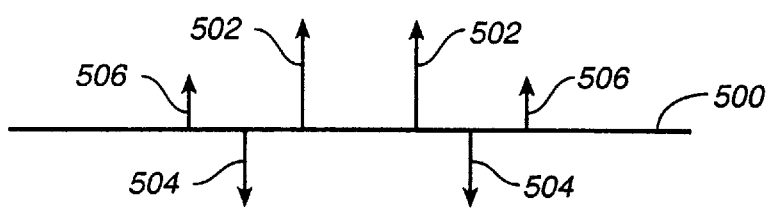
FIG._5
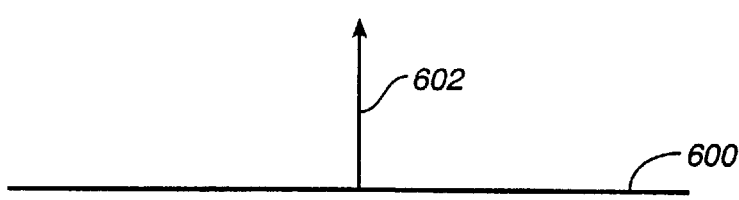
FIG._6

APPARATUS FOR ENHANCING IMAGE CONTRAST USING INTENSITY FILTRATION

This is a continuation of application Ser. No. 09/557,946, filed Apr. 4, 2000, which is a continued prosecution application of application Ser. No. 09/106,720, filed Jun. 29, 1998, now abandoned.

BACKGROUND OF THE INVENTION

1. Technical Field

The present invention relates generally to the field of semiconductor fabrication and in particular to photolithography processes used in the manufacture of semiconductor devices. Still more particular, the present invention relates to a method and apparatus for reducing degradation in the contrast of resist images produced from a mask image.

2. Description of the Related Art

Microcircuit fabrication requires that precisely controlled quantities of impurities be introduced into very small regions of a substrate. These regions are subsequently interconnected to created components and very large scale integration (VLSI) circuits. The pattern that define these regions are created by lithographic processes. Typically, photoresist materials are spun onto a wafer substrate. Then the photoresist is selectively exposed to radiation, such as ultraviolet light, electrons or x-rays. An exposure tool and a mask are used to cause the desired exposure of the photoresist. The patterns in the resist are formed when the wafer under goes a development step. The areas of photoresist remaining after development of the photoresist protect the covered regions of the substrate.

In the art of deep ultraviolet microlithography, much demand as technology develops is placed upon increased resolution, tighter placement of features in proximity to one another, and smaller but well-defined features. In order to continue meet increasing demands, many methods and devices have been developed and tested. One such concept is the control of images exposed onto a resist layer by enhancing the contrast of the said images.

In the process of patterning an image on a layer of resist on a wafer, light passes through openings on a mask, then through a lens chamber, and finally onto the wafer that is coated with resist. A "mask" is a pattern tool, which contains patterns that can be transferred to an entire wafer or to another mask in one exposure. At the resist level, portions of the resist that coincide with the image pattern are exposed and than developed to reproduce the same original image in a greatly reduced form. When light passes though the mask, sub harmonics are introduced into the intensity distribution of the aerial image. These sub harmonics cause the aerial image formed at the resist layer to be an inexact replica of the mask image. The resist image formed from the raw aerial image tends to have degraded contrast using presently available processes and equipment due to coinciding harmonics that are transmitted in addition to the desired zeroeth order element. Therefore, the same sub harmonics also limit the maximum resolution allowed in the final image. In order to reduce the distortions, previous methods improved the contrast by relying on the use of an extra layer that is formulated specifically for contrast enhancement coated on top of the resist layer.

However, such methods lengthen the processing of semiconductors by requiring additional process steps to place a coat of a contrast enhancement layer on top of the resist layer.

Therefore it would be advantageous to have a system and a method for enhancing contrast with minimal additional process steps.

SUMMARY OF THE INVENTION

The present invention provides an intensity filter for deep ultraviolet lithography for enhancing contrast. The intensity filter filters light having various intensities. The intensity filter includes a first material and a second material in which these two materials interface in such a way that only specific intensities are passed through. The first material is non-linear in nature and has a refractive index that changes at high intensities, but has a constant refractive index substantially equivalent to the second material at a selected intensity. The second material has a constant refractive index regardless of varying levels of intensity, at intensities lower than a specific minimum threshold. The filter also may include a coating that will phase shift the exiting filtered light 180-degrees.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 1 is a schematic illustrating the configuration of the invention itself and its relative positioning within a simplified exposure system in deep ultraviolet lithography;

FIG. 2 is a schematic demonstrating the effects of the invention on various degreed orders of light at different stages of the process flow through and resultant of the present invention;

FIG. 3 is a defraction pattern graph;

FIG. 4 is a relative intensity distribution graph;

FIG. 5 is a relative intensity distribution graph depicting the result of filtering the light as it passes through the phase shifted intensity filter cell in accordance with a preferred embodiment of the present invention; and FIG. 6 is a relative intensity distribution graph of light left from the filtered light is depicted in accordance with a preferred embodiment of the present invention.

DETAILED DESCRIPTION

The present invention provides a method and apparatus for passing only intensities that fall below a specific minimum threshold. The minimum threshold value can be set equivalent to the intensity of the zeroeth order harmonic. This value can be derived for the smallest feature size on the mask. By so doing, the zeroeth order harmonics for all the other features will be greater than the zeroeth order element for the minimum feature. Thereby the resulting image will be a "filtered" version of the aerial image consisting only of side lobes. Rather than compensating for the additional harmonics at the resist level, the present invention eliminates sub harmonics before they imprint on the resist itself. Therefore, the intensity filter system provided for by the present invention acts as a low pass filter.

The filter used in the present invention includes two properties. One property of the filter is that it should not pass light of an intensity above a certain critical value. The other property of the filter requires that it does pass light of any intensity below that specified value. The present invention provides for constructing an intensity filter cell comprised of at least tow materials. One desired material has a liner, or constant, refractive index. The other material has the quality of a non-linear or an intensity dependent, refractive index. These two materials interact together in such a way that, if placed correctly in the form of an enclosed cell, a very high contrast image will form in the resist after being developed. The tow materials in the depicted example are selected in such a way that the refractive indices of the material are equivalent at one or more selected intensities, such as, low intensities, and the elements are also to be essentially transmissive. In the depicted examples, low intensities are defined as intensities that are less than the intensity of the first harmonic of the smallest feature of the mask. A low intensity typically about 10 mJ. In the depicted examples, high intensities are defined as intensities equal to or greater than the intensity of the first harmonic of the smallest feature of the mask. High intensities are typically greater than 10 mJ. At high intensities, determined by the zeroeth order harmonic of the minimum feature, the refractive index of the non-linear material, will change substantially enough to cause the combined elements to have a mismatched refractive index. This mismatch in the refractive indexes between the two materials leads to poor transmission of light or even complete internal refraction. This event results in the blocking out of the high intensity components of the aerial image.

In addition to employing refractive index compatibility to filter out unwanted sub harmonics, the filter of the present invention also may employ a coating to enhance contrast. In the depicted example, the coating has a thickness such that a 180-degree phase shift in the light is produced. In the depicted example, the thickness of the coating for the intensity filter cell can be determined by the equation:

$$t=\lambda/4,$$

where $\lambda$ is equal to the wavelength of the incident light. The filtered and phased shifted light is them combined with the original light having an intensity distribution present prior to filtering using the intensity filter. The result of this union of the filtered and phase shifted light and the original light has an aerial image comprising of only the principle harmonic of the image. When this image is made incident on the photo resist layer, the contrast is markedly improved, thereby improving the resolution as well.

With reference to the figures and in particular to FIG. 1, a diagram of a photolithography apparatus is depicted in accordance with a preferred embodiment of the present invention. Photolithography system 100 receives light 102 at a specifically designed mask 104 from an illumination source (not shown). Mask 104 is used to describe a pattern to be exposed on a photo resist layer. Mask 104 is a photomask. Light 102 upon passing through the various openings in mask 104 is then diffracted resulting in sub harmonics being thereby introduced into the intensity distribution of the aerial image. The resultant light then enters the photolithography lens 106, which reduced the image size to the appropriate ratio, then passes into the beam splitter 108. Beam splitter 108 causes the light 102 to divide into two light beams 109 and 111. Light beam 109 travels along a path created by a light guiding apparatus, which in the depicted example includes mirror reflector 110 and mirror reflector 112. Light beam 111 travels through intensity filter cell 114. The light beam 111 is rejoined with light beam 109 as an unfiltered version of the original light with the additional sub harmonics.

Light beam 111 is filtered as it passes through intensity filter cell 114, which includes material 116, material 118, anti-reflective layer 120, anti-reflective layer 122, phase shifter 124, and high intensity absorber 125. Material 116 is a material that has a refractive index that is linear, or constant. Material 118 has a refractive index that is non-linear, or intensity dependent, nature. A linear material is a material that has a constant index of refraction in which the index of refraction is independent incident intensity, which is described as follows:

$$n=n_0$$

wherein n is the index of refraction and $n_0$ is a constant. This constant is typically selected to correspond to the refractive index of the lens element, such as photolithography 106 in FIG. 1. In the depicted example, a non-linear material is a material that has a constant index of refraction at a low intensity and an index of refraction dependent on the intensity of incident light at a high intensity. The index of refraction of a non-linear material may be described as follows:

$$n=n_0, E<Ea$$

$$n=n_0 \pm n_0 * E/Ea, E>Ea$$

where E is the intensity of incident light and Ea is the intensity at which other material switches from a constant index of refraction to an intensity dependent refractive index of refraction. An example of a non-linear material is MBBA:N-(p-methoxybenzylidene)-p-butylaniline.

A large class of well-known organic and non-organic non-linear optical materials exists, wherein these materials each have a refractive index that changes with the incident intensity. Each of these materials possesses one constant index of refraction when (1) the intensities fall below a specific critical intensity level, and (2) has a different refractive index that is variable when the intensities surpass that specific level of intensity. Material 116 and 118 are closed such that the pertinent refractive index of each at specific levels of intensity reacts in a predetermined manner. Material 116 and material 118 are selected such that at low intensities the refractive index of each are equivalent to the other index of refraction, and therefore are transmissive in accordance with a preferred embodiment of the present invention. However, the refractive index of non-linear material 118 will change at high intensities and results in non-identical refractive indices, which results in poor transmission of light, or ideally complete internal refraction. In the depicted example, the high intensity levels are established by the zeroeth order harmonic of the minimum feature of the pattern to be made incident on the resist layer. Examples of suitable linear materials include quartz or fused silica.

Examples of some materials that may be used for non-linear optical material 118 are as follows:

MBBA: N-(p-methoxylbenzylidene)-p-butylaniline

MEBBA: 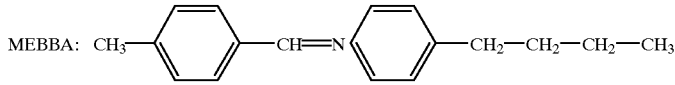

PePMeoB: 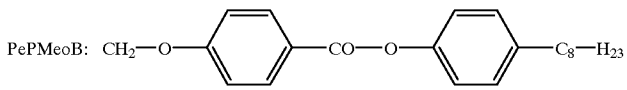

and

BuPPeB: 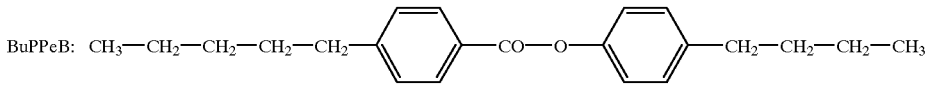

IN the depicted example, positioning of material 116 and material 118 within intensity filter cell 114 provides one possible configuration. High intensity absorber 125 may be formed using a glass plate coated with an absorbing film, such as silicon. High intensity absorber 125 in the depicted example is positioned such that it is in contact with one edge of material 118 as shown in FIG. 1. If the order of the two optical materials are reversed, i.e., material 118 and material 116 are switched, the absorber would be moved to the opposite side of intensity filter cell 114, such that it is still in contact with material 118. In the depicted example, the intensity filter cell will have a dimension at least equal to a reduced image of the mask after passing through the lens. These dimensions are typically about 25 mm by 25 mm. The filter establishes a filtered variation on the original light beam. Material 116 and material 118 are enclosed between anti reflective layers 120 and 122. The light exiting intensity filter 114 then passes through the phase shifter 124, wherein the phase of the light is shifted 180-degrees. The necessary thickness of the coating comprising phase shifter 124 is determined by the equation $t = \lambda/4$, where $\lambda$ is equal to the wavelength of the incident light.

A number of different types of phase shifting materials may be sued for the coating. For example, chrome and calcium fluoride may be used as a coating. Phase shifter 124 is employed to reverse (or to phase shift by 180 degrees) the intensity distribution coming out of a filter. When combined with an unshifted distribution of light in light beam 109, all of the subharmonics except the zeroeth order are removed, as illustrated in FIG. 6 below. When the light exits the intensity filter cell, the light has specific intensities filtered out and is phase shifted. The resultant light is then combined with the original distribution of light split beam splitter 108 and is deterred by mirror reflector 110 and mirror reflector 112, thereby the resulting aerial image is inclusive of only the principle harmonic of the image. The desired aerial image is then made incident on the resist layer 126 coating the wafer 128. The image exposed onto the resist layer at this point has an enhanced contrast, and therefore the image also exhibits improved resolution.

Referring now to FIG. 2, a diagram detailing the effects of the present invention on the different orders of light as it passes through a mask is depicted in accordance with a preferred embodiment of the present invention. Light 202 from the illumination source again passes through mask 203 only at specific openings set within the opaque material in mask 204. Specifically, light passes through opening 206 in mask 204 and are blocked by opaque portions 208 and mask 204. FIG. 3 is a defraction pattern graph. When light 202 passes through opening 206 of mask 204, light 202 trough diffraction, acquires additional and unwanted sub harmonics as depicted in the diffraction pattern graph 300 in FIG. 3.

With reference now to FIG. 4, a relative intensity distribution graph is depicted. The light pattern, after diffraction, is again represented in the relative intensity distribution graph 400. This graph shows a first order of light 402, a second order of light 404, and a third order of light 406 along with a original zeroeth order of light 408. With these undesired harmonics, the aerial image when made incident upon the resist layer exhibits degradation in the resultant resist image, thereby limiting the proximity that two neighboring features can be placed together. When the sub harmonics are not countered, the diffracted aerial images from the two neighboring features will coincide, which results in a loss of resolution.

With reference now to FIG. 5, a relative intensity distribution graph 500 depicting the result of filtering the light as it passes through the phase shifted intensity filter cell is illustrate in accordance with a preferred embodiment of the present invention. In relative intensity distribution graph 500, the zeroeth order of light has been removed from the light, and the remaining sub harmonics have been phase shifted 180-degrees. As can be seen, the first order of light 502, second order of light 504, and third order of light 506 are phase shifted 180 degrees from those in FIG. 4. When the resulting light is then combined with the original light pattern, the 180-degree phase shifted harmonics and their original respective unfiltered and non-shifted harmonics cancel each other out, leaving only the desired zeroeth order of light as exhibited in the final intensity distribution graph 500.

With reference now to FIG. 6, a relative intensity distribution graph 600 of light left from the filtered light is depicted in accordance with a preferred embodiment of the present invention. In relative intensity distribution graph 600, a zeroeth order of light remains after filtering.

The method and apparatus so described can be built in various manners and forms depending on the implementation. In the depicted example material 116 and material 118 must be situated and confined within an enclosed cell that is encapsulated with an ant-reflective material, and the exiting end is covered with a 180-degree phase shifting compound.

Thus with deep ultraviolet lithography and the constant demand for smaller and closer set features, the present invention provides the required resolution increases needed to maintain functionality of the components with the semiconductor devices. Thus, the present invention provides an improved approach to the concept of contrast enhancement by introducing an "intensity filtration" system between the resist and the lens, thereby preventing the sub harmonics from travelling to the resist layer. The present invention provides this advantage by filtering off harmonics in the intensity distribution of the aerial image in a DUV lithography system. By filtering off specific harmonics, the method and apparatus provides an improved contrasting the resist image. The resulting image will also be free of harmonic sidelobes. These improvements allow two adjacent features to be located closer together without interference from each other. Without the enhancement in contrast, the same features in the same locations would lose resolution due to the fact that the diffracted aerial images of the two features would coincide.

The description of the preferred embodiment of the present invention has been presented for purposes of illustration and description, but is not limited to be exhaustive or limited to the invention in the form disclosed. Many modifications and variations will be apparent to those of ordinary skill in the art. The embodiment was chosen and described in order to best explain the principles of the invention the practical application to enable others of ordinary skill in the art to understand the invention for various embodiments with various modifications as are suited to the particular use contemplated.

What is claimed is:

1. An apparatus comprising:
   a lens;
   a beam splitter, wherein light passing through the lens is split into a first light beam and a second light beam;
   a filter including:
   an input, wherein light passing thorough the lens is received at the input;
   a linear material having a first refractive index;
   a nonlinear material having a second refractive index, wherein the second refractive index varies from a first intensity of light to a second intensity of light; and
   an output,
   wherein the first refractive index substantially matches the second refractive index at the first intensity of light such that light of the first intensity in the first light beam is passed though the filter and wherein the first refractive index and the second refractive index are mismatched at the second intensity of light such that light of the second intensity in the first light beam is blocked from passing through the filter to the output; and
   a light guiding apparatus, wherein the light guiding apparatus receives the second light beam and guides the second light beam such that the second light beam merges with the first light beam at the output of the filter, wherein a merged light beam is formed.

2. The apparatus of claim 1, wherein the filter further includes a phase shifter, wherein the phase shifter shifts the phase of the light 180 degrees at the output of the filter.

3. The apparatus of claim 1, wherein the phase shifter us a coating having a thickness determined as follows:

$$t=\lambda/4,$$

where $\lambda$ is equal to the wavelength of incident light.

4. The apparatus of claim 2, wherein the filter includes a first antireflective layer located between the input and the first and second materials and a second antireflective material located between the phase shifter and the first and second materials.

5. The apparatus of claim 1, wherein the first refractive index is selected using the following:

$$n=n_0$$

wherein n is a refractive index and $n_0$ is a constant.

6. The apparatus of claim 5, wherein the second refractive index is selected using the following:

$$n=n_0, E<Ea$$

$$n=n_0 \pm n_0*E/Ea, E>Ea$$

wherein n is a refractive index and $n_0$ is a constant, E is an intensity of incident light, and Ea is an intensity at which a material switches from a constant index of refraction to an intensity dependent refractive index of refraction.

7. The apparatus of claim 1, wherein the nonlinear material is N-(p-methoxybenzylidene)-p-butylaniline.

8. The apparatus of claim 1 further comprising a mask located between the lens and a light source.

9. The apparatus of claim 1, wherein the light guiding apparatus includes a mirror deflector.

* * * * *